United States Patent [19]

Suzuki et al.

[11] Patent Number: 5,365,768
[45] Date of Patent: Nov. 22, 1994

[54] SENSOR

[75] Inventors: Seiko Suzuki, Hitachioota; Kazuo Kato, Toukai; Masahiro Matsumoto, Hitachi; Shigeki Tsuchitani, Mito; Masayuki Miki; Yoshihiro Yokota, both of Katsuta, all of Japan

[73] Assignee: Hitachi, Ltd., Tokyo, Japan

[21] Appl. No.: 166,148

[22] Filed: Dec. 14, 1993

Related U.S. Application Data

[63] Continuation of Ser. No. 971,261, Nov. 4, 1992, abandoned, which is a continuation of Ser. No. 553,307, Jul. 17, 1990, abandoned.

[30] Foreign Application Priority Data

Jul. 20, 1989 [JP] Japan ................... 1-186026

[51] Int. Cl.$^5$ ............... G01D 5/252; G01D 3/04; G01P 21/00
[52] U.S. Cl. .................. 73/1 R; 73/497; 73/517 R; 73/708; 364/566; 364/571.01
[58] Field of Search .......... 73/1R, 1 D, 4 R, 4 V, 73/497, 517 R, 708; 364/571.01–571.08, 566

[56] References Cited

U.S. PATENT DOCUMENTS

| | | | |
|---|---|---|---|
| 3,634,868 | 1/1972 | Pelavin et al. | 73/1 R X |
| 3,781,869 | 12/1973 | Sudnick et al. | 73/1 R X |
| 4,211,119 | 7/1980 | Wolber | 73/4 V X |
| 4,434,465 | 3/1984 | Adulfsson et al. | 73/724 |
| 4,446,715 | 5/1984 | Bailey | 364/571.02 X |
| 4,573,133 | 2/1986 | White | 364/571.04 |
| 4,622,646 | 11/1986 | Waller et al. | 364/571.02 |
| 4,777,826 | 10/1988 | Rud, Jr. et al. | 73/708 |
| 4,794,325 | 12/1988 | Britton et al. | 73/1 R X |
| 4,829,821 | 5/1989 | Carome | 73/517 R X |
| 4,845,649 | 7/1989 | Eckardt et al. | 364/571.02 |
| 4,858,615 | 8/1989 | Meinema | 364/571.01 X |
| 4,879,669 | 11/1989 | Kihara et al. | 364/571.01 X |
| 4,935,818 | 6/1990 | Wong | 358/76 X |
| 4,949,029 | 8/1990 | Cooper et al. | 364/571.04 X |
| 5,016,187 | 5/1991 | Forkert et al. | 364/571.04 X |
| 5,018,087 | 5/1991 | Dannenberg | 364/571.07 X |
| 5,086,777 | 2/1992 | Hishii | 73/4 R X |
| 5,121,118 | 6/1992 | Hermann | 364/571.01 X |
| 5,163,325 | 11/1992 | White et al. | 73/517 R |

FOREIGN PATENT DOCUMENTS

| | | | |
|---|---|---|---|
| 3201198 | 9/1982 | Germany . | |
| 3446248 | 6/1986 | Germany . | |
| 3544095 | 10/1987 | Germany . | |
| 3713643 | 11/1988 | Germany | 73/1 R |
| 3804486 | 8/1989 | Germany | 73/1 R |
| 54661 | 5/1979 | Japan | 73/1 R |
| 115360 | 7/1983 | Japan | 73/1 R |
| 91514 | 3/1990 | Japan | 73/1 R |

OTHER PUBLICATIONS

"Silicon Microaccelerometer"; *Transducers* '87 pp. 395–398 Felix Rudolph et al; Jun. 2–5, 1987, Tokyo, Japan.

"A Silicon Based Micromechanical Accelerometer with Cross Acceleration Sensitivity Compensation"; *Transducers* '87.

H. Sandmaier et al; Jun. 2–5, 1987, Tokyo, Japan; pp. 399–402.

*Primary Examiner*—Thomas P. Noland
*Attorney, Agent, or Firm*—Antonelli, Terry, Stout & Kraus

[57] ABSTRACT

A signal processor (5) is coupled to a detector (6) for detecting a physical quantity. The signal processor has a zero adjustment memory (14) and a sensitivity adjustment memory (16). The zero adjustment memory and the sensitivity adjustment memory have a number of switches (20, 20A, 20', 20"), respectively. These switches are changed over digitally using a zener zapping method or a polysilicon fuse method at each switch to adjust the characteristics of the detector.

22 Claims, 13 Drawing Sheets

SENSOR

This application is a continuation of now abandoned application Ser. No. 07/971,261 filed Nov. 4, 1992, which was a continuation of application Ser. No. 07/553,307, filed Jul. 17, 1990, also abandoned.

FIELD OF THE INVENTION

The present invention relates to a sensor for detecting acceleration or pressure. More specifically, the present invention relates to a sensor usable for controlling a body or an engine of a vehicle.

BACKGROUND OF THE INVENTION

Every kind of a car body control system or engine control system has been developed to clear all sorts of regulations of the car and to give a good ride in the car. There is an acceleration sensor or a semiconductor pressure sensor required for these systems.

Since the acceleration sensor used for a car, for instance, has to detect acceleration which is comparatively small and has considerably long fluctuation cycles, a semiconductor electrostatic capacitance type acceleration sensor or a semiconductor strain gage type acceleration sensor has been used mainly.

However, these conventional sensors have characteristics which fluctuate after they are manufactured. Accordingly, it is necessary to adjust the detection sensitivities and/or the zero points with a signal processing circuit. For instance, one adjusting method is that a signal processing circuit is formed by a printed circuit board, and one resistance element of an output adjustor of the printed circuit board has to be selected for obtaining an adjusted output signal of the sensor. Another adjusting method is that the signal processing circuit is formed by a hybrid integrated circuit, and one resistance element of the output adjustor of the hybrid integrated circuit has to be selected by laser trimming to obtain an adjusted output signal of the sensor.

However, the size of the conventional signal processing circuit of the sensor is large so that the cost thereof becomes high. Moreover, the wiring length between the detector and the signal processing circuit becomes long and the number of the wires is increased. As a result, a drawback that occurs in the conventional sensor is that the probability of breakage of wires becomes high due to temperature variation or acceleration.

On the other hand, it is considered that the signal processing circuit is integrated, thin film resistances are formed on the integrated circuit and the resistance is trimmed analogously using a laser to adjust the resistance value. However, in the sensor made by the above-mentioned method there occurs easily secular change at the trimmed resistance value so that the sensor lacks reliability as an acceleration sensor. In this kind of acceleration sensor, there is prior art relating to the semiconductor electrostatic capacitance type sensor disclosed on pages 395 to 398 and relating to the semiconductor strain gage type sensor disclosed on pages 399 to 402 of "Transducer '87 The 4th International Conference on Solid-State Sensors and Actuators" published on Jun. 2-5, 1987 in Tokyo, Japan.

The above-mentioned prior art has a drawback in that the variations of the sensitivity and the zero point generated at manufacturing of the detectors are not adjusted perfectly, and the size of the sensors are large; the cost thereof is high, and they lack in reliability.

SUMMARY OF THE INVENTION

An object of the present invention is to provide a sensor which is small in size, easy to mount on a vehicle, low in cost and highly reliable.

To attain the object, the present invention discloses that the sensor is formed in such a manner that the state of the signal processor coupled to the detector is changed over digitally by a selective current transmission from an electric power source of the signal processor or a microcomputer mounted on the sensor to the signal processor, so that the characteristic of the signal processor is selectively changed over. More specifically, the present invention discloses that the memory states of a zero adjustment memory and/or a sensitivity adjustment memory of the signal processor are selected digitally on the signal processor so that the characteristic of the signal processor is changed over, as is apparent from explanation mentioned later, whereby the sensitivity and/or the zero point thereof are adjusted easily.

Accordingly, the present invention is able to adjust the characteristics of the sensitivity and/or the zero point of the sensor easily, strong at secular change and holds high reliability.

Since the zero adjustment memory and the sensitivity adjustment memory are mounted on the signal processor which forms an integrated circuit, the detector and the signal processor are mounted on the same circuit substrate so that the size of the sensor can be kept small, mounting of the sensor on the vehicle is easy, and cost of the sensor becomes low.

Since the wiring length between the detector and the signal processor of the present invention is short and the number of the wires therebetween can be made small, trouble at the wires does not occur, and reliability of the sensor is enhanced.

DETAILED DESCRIPTION OF THE PREFERRED EMBODIMENTS

Figure 1:
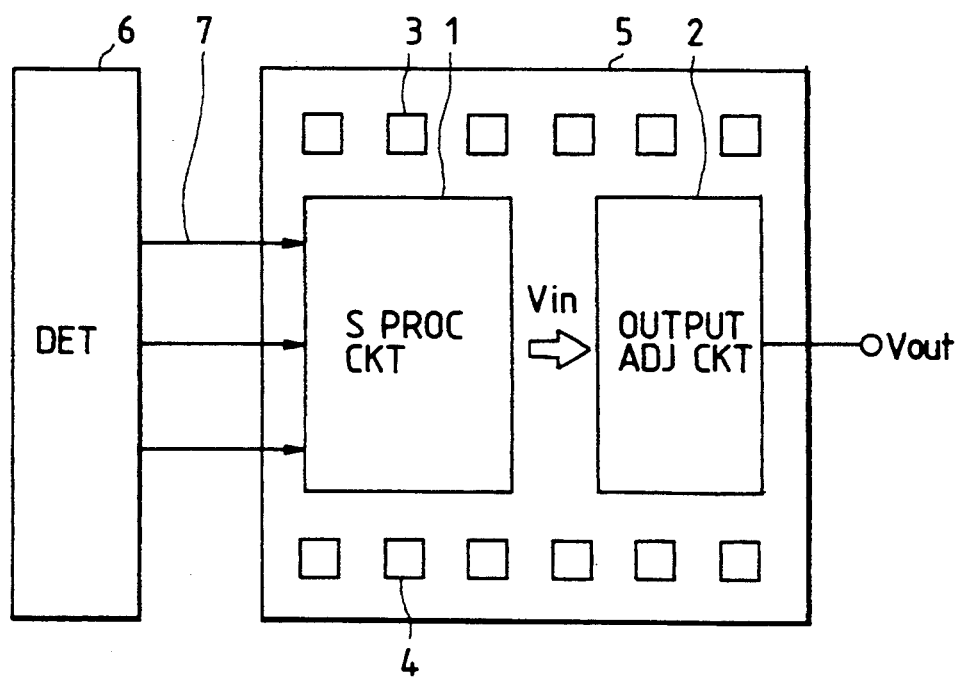
FIG. 1 illustrates the first embodiment of the present invention.

Referring to FIG. 1, 1 denotes the signal processing circuit, 2 the output adjustment circuit. 3 shows pads arranged in a line, respectively, for adjusting the sensitivity of the sensor and 4 shows pads arranged in a line, respectively, for adjusting the zero point of the sensor. These circuits 1, 2 and pads 3, 4 are integrated to form the integrated circuit IC. 5 denotes the signal processor made by the IC. 6 denotes the detector or the sensor element. The detector 6 is connected to the signal processor 5 through lead wires 7. A number of conductive pads 3 and 4 are provided to form necessary bits corresponding to the adjustment quantity of the sensor 6. The states of two internal memories 14 and 16 (FIG. 7) used for adjusting the sensitivity and the zero point at the output adjustment circuit 2 are changed over by selecting any necessary pads among the pads 3 and 4 and applying voltage to the selected pads, as explained later. The sensitivity and the zero point compensations are fixed to one selected characteristic, respectively, by applying voltages to the selected pads.

We will explain hereunder the adjustment methods of the sensitivity and the zero point compensations referring to FIGS. 7–18. It is inevitable that there is fluctuation in the characteristics of the sensitivity and the zero point in the detector 6. Accordingly, these adjustments are unavoidable in all sensors.

After the sensor is assembled, the adjustments take place. At first, an acceleration G applied to the sensor is varied, and the output signal Vout of the output adjustment circuit 2 is measured. For instance, when the measuring range of the sensor is $0 - +1G$ ($1G=9.8$ m/s$^2$), the output signal Vout is measured at $G=0$, and $G=\pm 1$. Since a general acceleration sensor has a directional quality in its detecting characteristic, the measurement can take place easily by inclining the sensor element using the acceleration of gravity. As a result, the sensitivity characteristic and the zero point position of the sensor to be adjusted can be obtained by well known methods.

After the sensitivity characteristic and the zero point position of the sensor are obtained, the compensation quantity which is demanded for the adjustment is calculated, and the specific pads corresponding to the compensation quantity are selected among the pads 3 for adjusting the sensitivity and the pads 4 for adjusting the zero point. Then, a predetermined voltage is applied to the selected pads, and the circuit memories 14 and 16 of the output adjustment circuit 2 are fixed to a specific state.

As a result, the characteristic of the signal processing circuit 1 can be selected and fixed digitally, the sensitivity characteristic and the zero point of the detector 6 are adjusted within the predetermined range so that the sensitivity characteristic and the zero point position are adjusted and compensated to a predetermined value.

Figure 2:
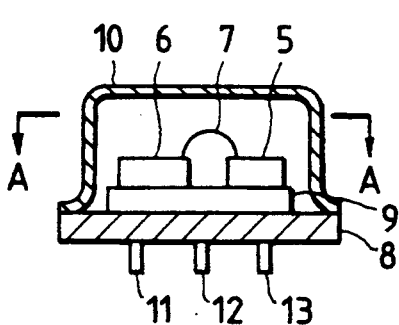
FIG. 2 shows a side sectional view of the sensor shown in FIG. 1.
Figure 3:
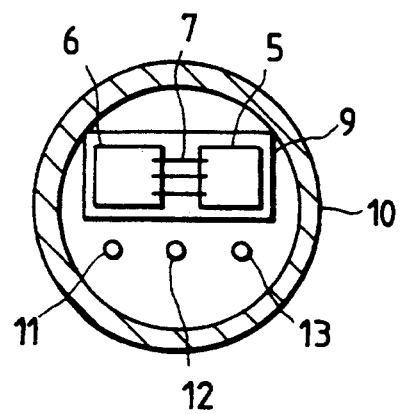
FIG. 3 shows a front sectional view along the A—A line shown in FIG. 2.
Figure 8:
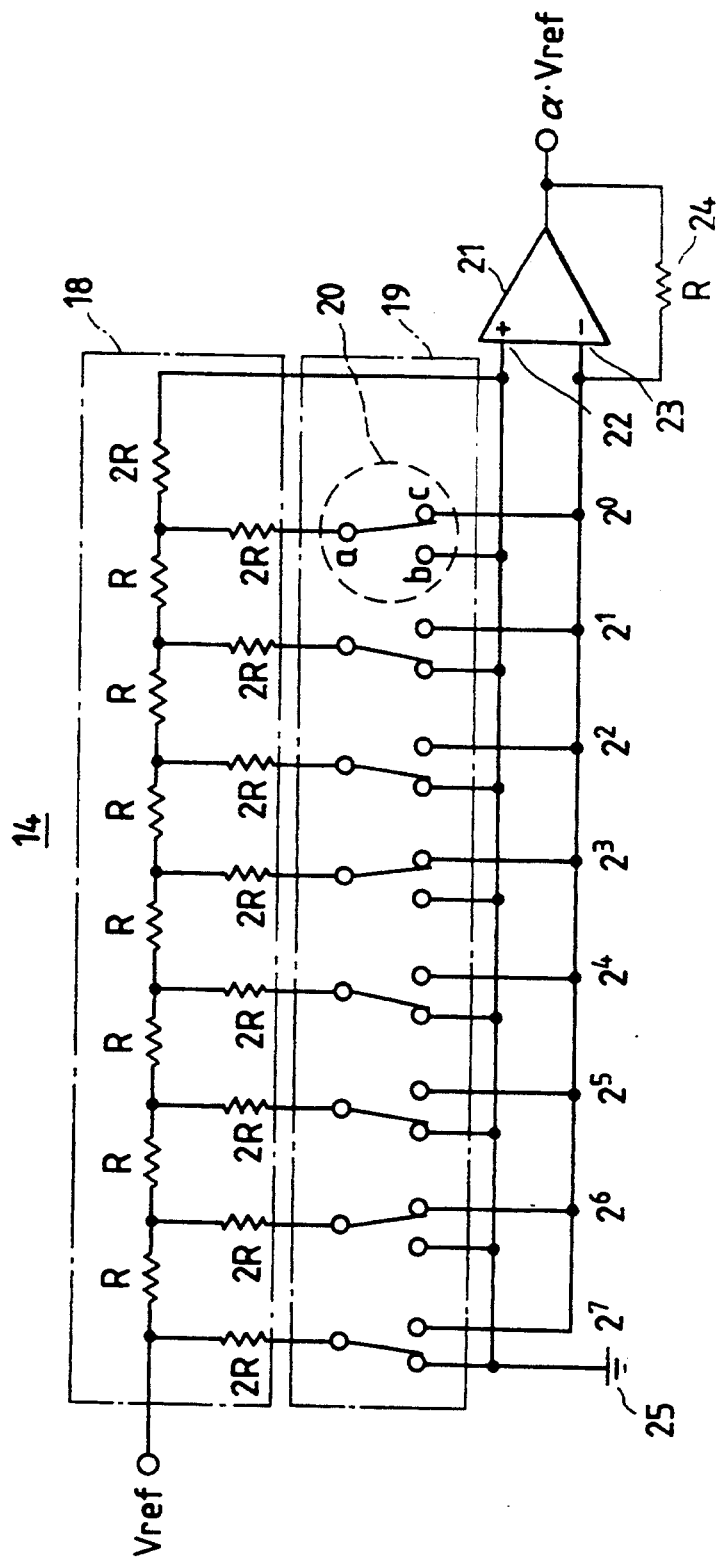
FIG. 8 shows a zero point adjustment memory formed by ladder type resistors in the signal processor of one embodiment of the present invention.

Referring to FIGS. 2 and 3, 8 denotes a stem, 9 a substrate, 10 a cover. 11 and 12 are electric power source terminals. 13 shows an output terminal. As is apparent from FIGS. 2 and 3, the signal processor 5 and the detector 6 are mounted on the substrate 9. The signal processor 5 and the detector 6 are connected through the lead wires 7. The substrate 9 is attached on the stem 8.

The characteristic of the signal processing circuit 1 is determined by selecting and fixing the characteristic of the output adjustment circuit 2 using the digital method of selective current transmission to any of the above-mentioned pads 3 and 4. After the compensation of the detector 6 is finished, the cover 10 is fixed to the stem 8 in an air tight manner to provide the sensor.

Figure 4:
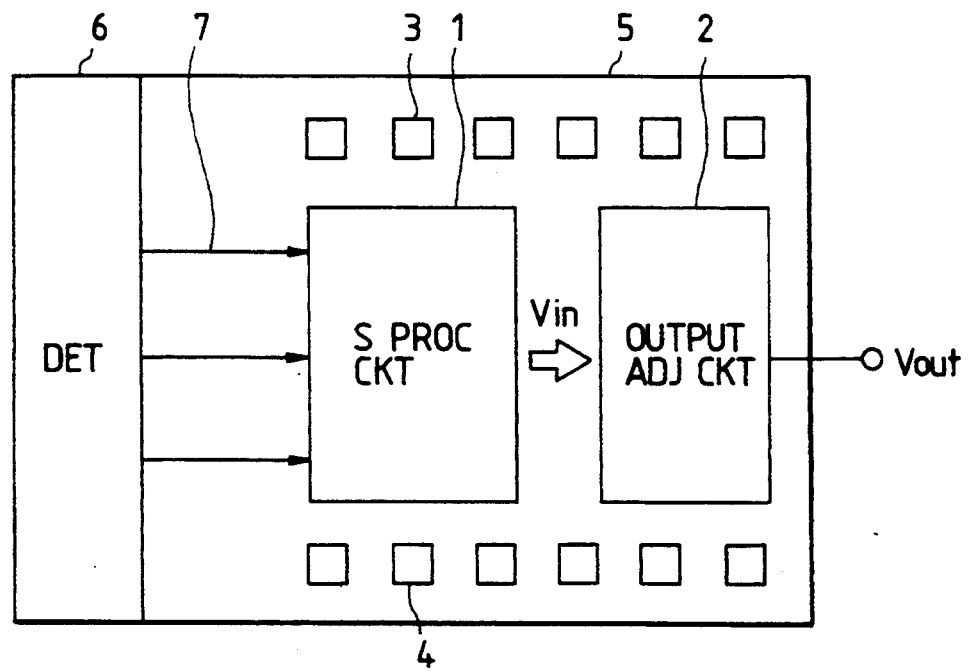
FIG. 4 illustrates the second embodiment of the present invention.

FIG. 4 shows the second embodiment in which the detector 6 is attached to the signal processor 5.

Figure 5:
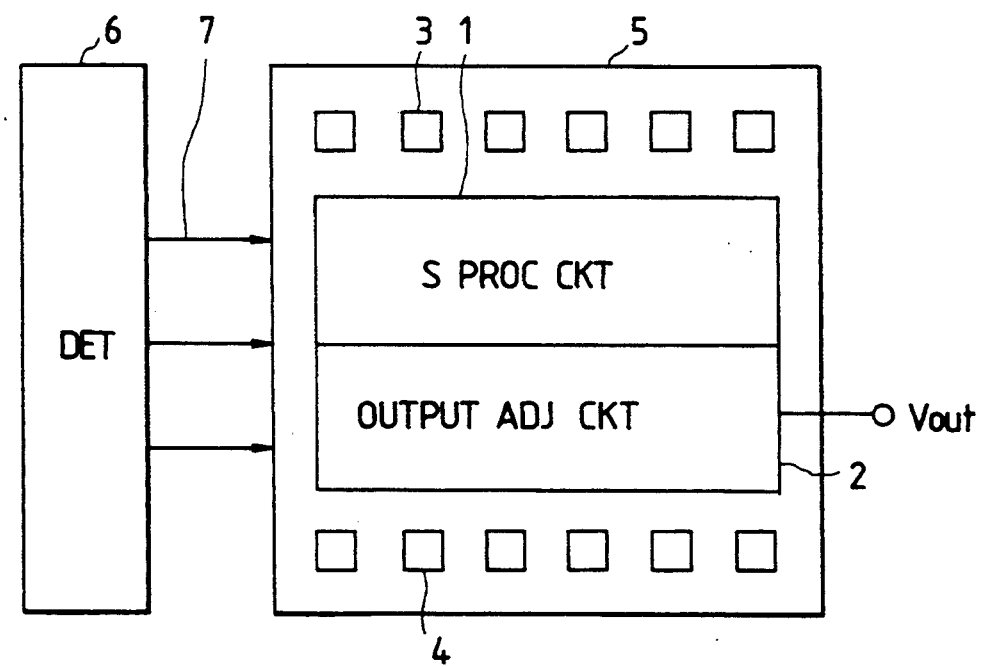
FIG. 5 illustrates the third embodiment of the present invention.

FIG. 5 shows the third embodiment in which the signal processing circuit 1 and the output adjustment circuit 2 are attached to each other on the signal processor 5.

Figure 6:
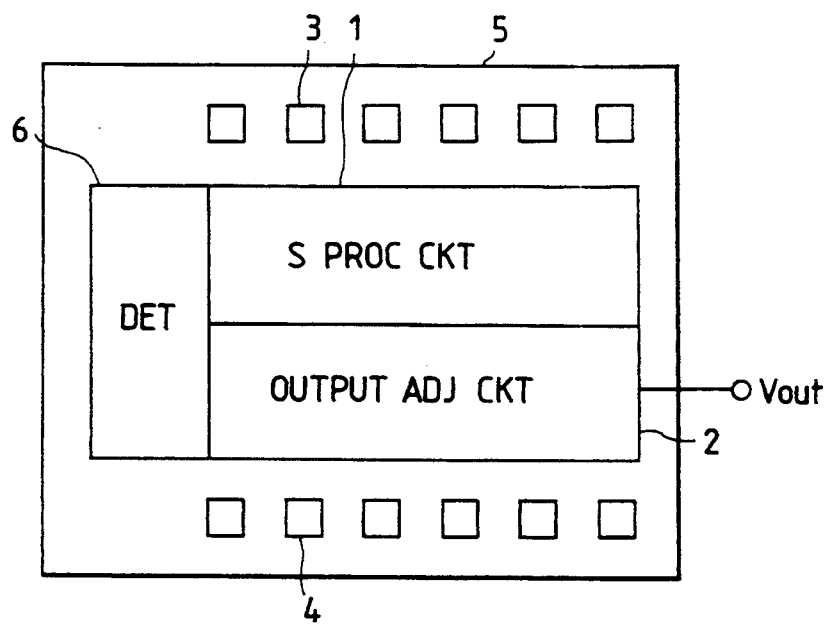
FIG. 6 illustrates the 4th embodiment of the present invention.

FIG. 6 shows the fourth embodiment in which the detector 6, the signal processing circuit 1 and the output adjustment circuit 2 are attached in a unitary manner on the signal processor 5.

Figure 7:
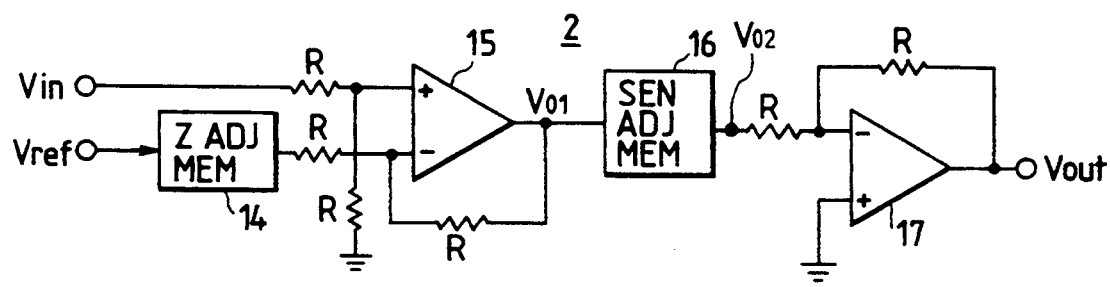
FIG. 7 shows a circuit diagram of the signal processor of one embodiment of the present invention.

Referring to FIG. 7, the output adjustment circuit 2 comprises the zero adjustment memory 14, a differential amplifier 15, the sensitivity adjustment memory 16 and a differential amplifier 17. Each differential amplifier 15, 16 is connected with an input resistance and a feedback resistance. These resistors have the same resistance value R. The output of the signal processing circuit 1 is inputted to the noninverting input terminal of the differential amplifier 15 as the input signal Vin through the input resistance. The output of the differential amplifier 15 is supplied to the inverting input of the differential amplifier 17 through the sensitivity adjustment memory 16 and the input resistor. The reference voltage Vref is inputted to the zero adjustment memory 14.

Suppose that the adjustment index of the zero adjustment memory 14 is $\alpha$ and the adjustment index of the sensitivity adjustment memory 16 is $\beta$. The output signal V01 of the differential amplifier 15 is as follows:

$$V01 = Vin - \alpha \cdot Vref \qquad (1)$$

The α·Vref of the second term in the right side of the formula (1) is the zero adjustment term. Accordingly, the zero point position of the detector 6 is adjusted by varying the term. Since the Vref is fixed by the reference voltage in the output processor 5, the zero point can be adjusted by selecting the adjustment index α of the zero adjustment memory 14.

Next, suppose that the output signal of the sensitivity adjustment memory 16 is V02. Sensitivity adjustment memory 16 includes an inverter, and so the output signal V02 is as follows:

$$V02 = \beta \cdot (\alpha \cdot Vref - Vin) \tag{2}$$

Since the output signal V02 is proportional to the adjustment index β as shown in the formula (2), the sensitivity can be adjusted by selecting the adjustment index β of the sensitivity adjustment memory 16.

The output signal of the differential amplifier 17, namely, the output signal Vout of the output adjustment circuit 2, is as follows:

$$Vout = \beta \cdot (Vin - \alpha \cdot Vref) \tag{3}$$

The Vout corresponds to the output signal V02 whose polarity is inverted from the polarity of the Vout.

Accordingly, the fluctuations of the zero point and the sensitivity characteristics which reside in the detector 6 can be compensated by selecting the adjustment indices α, β of the zero adjustment memory 14 and the sensitivity adjustment memory 16, respectively. Then, the compensated output signal Vout can be outputted from the output adjustment circuit 2.

We will hereunder explain the zero adjustment memory 14 and the sensitivity adjustment memory 16.

Referring to FIG. 8, 18 denotes a ladder type resistor network comprising resistance elements whose resistance values are R and 2R. 19 denotes a memory which is explained later. The zero adjustment memory 14 comprises the ladder type resistors 18, the memory 19, a differential amplifier 21 and a feedback resistance 24. The memory 19 is formed by a number of switches 20. In FIG. 8, the ladder type resistor network 18 includes seven resistors R and nine resistors 2R, and the memory 19 includes eight switches 20. Each switch 20 has a weighting of $2^0$-$2^7$ relating to the resistance of the ladder type resistor network 18. Each switch 20 has three terminals a, b and c. The terminal a can be connected to either one of the terminal b or c. All the terminals b are connected to ground at point 25. Each terminal c is connected to the inverting input terminal 23 of the differential amplifier 21. The noninverting input terminal 22 of the differential amplifier 21 is connected to ground at point 25. The switch 20 is caused to connect its terminal a to either the terminal b or the terminal c by applying voltage selectively to each pad 4 used for zero point adjustment, as explained later. The zero point adjustment memory 14 determines a ratio of the reference voltage Vref which is inputted through the ladder type resistor network 18 to each switch 20 within the memory 19, so that the above-mentioned adjustment index α is selected. As a result, an output signal having the voltage value of α·Vref is generated as the output signal of the differential amplifier 21.

Suppose that the terminals a of the switches 20 of each bit of $2^1$, $2^2$, $2^4$, $2^5$ and $2^7$ are connected to the terminals b, and the rest of the switch terminals a are connected to the terminals c. In this case, the adjustment index α is as follows:

$$\alpha = 73/255 \tag{4}$$

Accordingly the output signal α·Vref of the differential amplifier 21 is as follows:

$$\alpha \cdot Vref = 73/255 \times Vref \tag{5}$$

The output signal, which is necessary for the zero point adjustment, is obtained by selecting the connecting state of the switches 20 within the memory 19.

Figure 9:
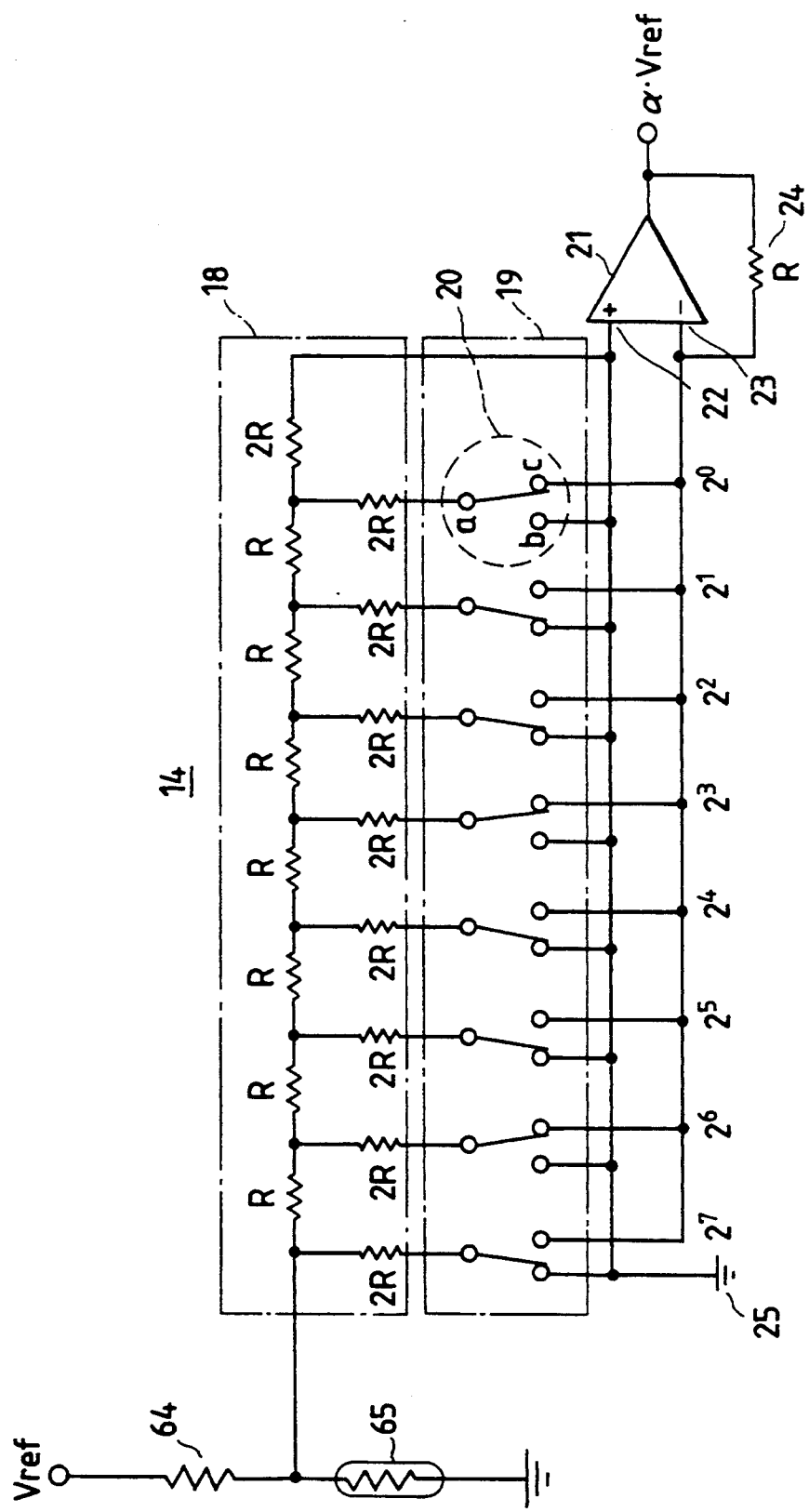
FIG. 9 shows the zero adjustment memory having a temperature characteristic compensator in the embodiment shown in FIG. 8.

Referring to FIG. 9, 65 denotes a thermistor, and 64 a resistor. Temperature compensation of the sensor can take place with the thermistor 65.

Figure 10:
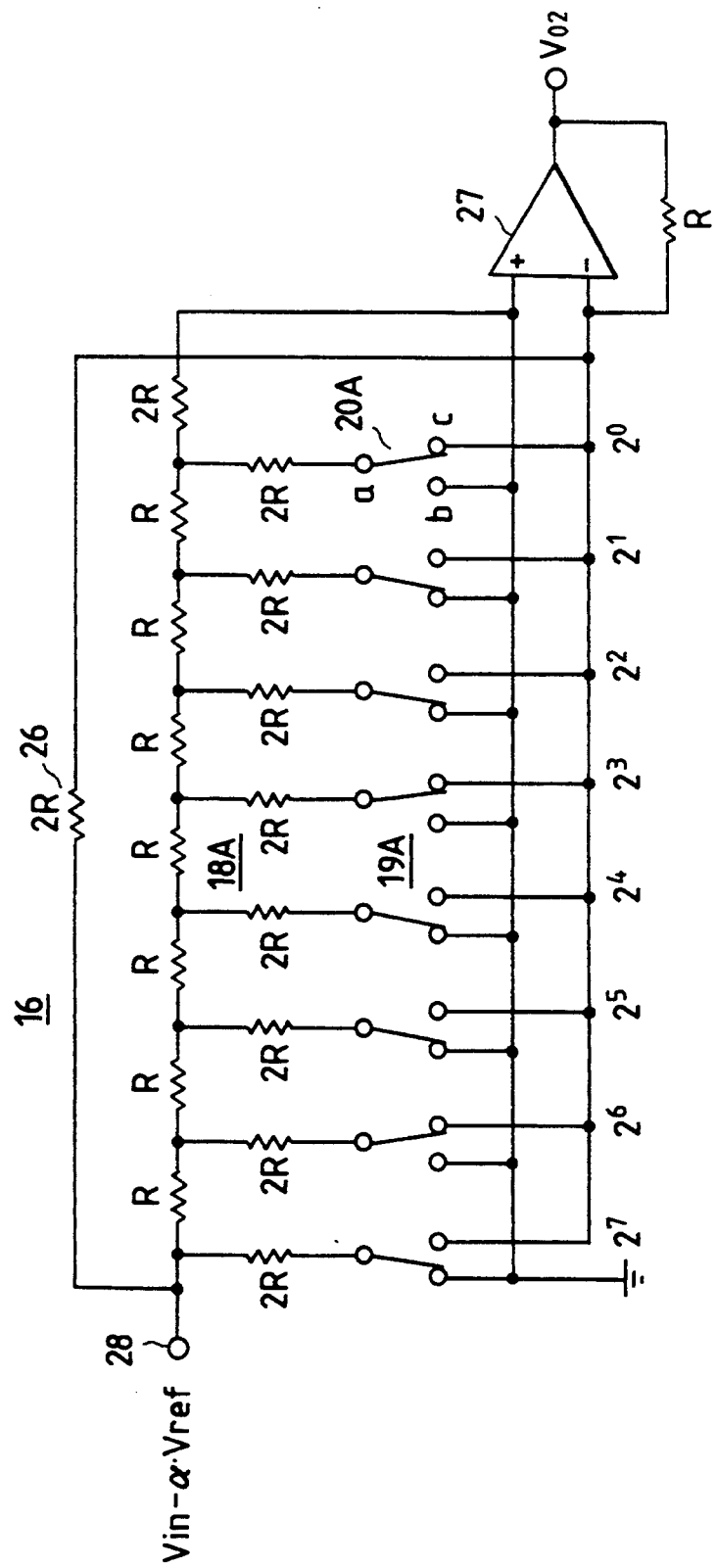
FIG. 10 shows a sensitivity adjustment memory formed by ladder type resistors in the signal processor of one embodiment of the present invention.

Referring to FIG. 10, the fundamental structure of the sensitivity adjustment memory 16 is same as that of the zero adjustment memory 14 shown in FIG. 8. The sensitivity adjustment memory 16 is formed by the ladder type resistor network 18A which comprises eight sets of resistors R and 2R, the memory 19A which comprises the switches 20A, the differential amplifier 27, and the resistance 26 connected between the input terminal 28 of the sensitivity adjustment memory 16 and the inverting input terminal of the differential amplifier 27.

Suppose that the output signal Vin−α·Vref of the differential amplifier 15 shown in FIGS. 8 and 9 is inputted to the input terminal 28. The output signal V02 of the differential amplifier 27 is as follows, as explained in formula (2):

$$V02 = \beta \cdot (\alpha \cdot Vref - Vin) \tag{6}$$

The adjustment index β of the sensitivity adjustment memory 16 is determined by selecting and changing over each switch 20A of the memory 19A. The sensitivity fluctuation of the detector 6 is compensated digitally depending on the state of the changeover of the switches 20A of the memory 19A.

Referring to FIG. 10, since the terminals a of the switches 20A of the bits of $2^1$, $2^2$, $2^4$, $2^5$ and $2^7$ are connected to the terminals b, and the terminals a of the other switches are connected to the terminals c, the adjustment index β is as follows:

$$\beta = 1 + 73/255 \tag{7}$$

We will explain hereunder the embodiments of the memories 19 and 19A.

These memories are formed in the signal processor or the IC 5 in the embodiments. The changeover state of the switches 20 and 20A is determined by selective current transmission to the conductive pads 3 and 4.

The changeover of the switches 20 and 20A which constitute a part of the memories 19 and 19A is carried out, for instance, by using a zener zapping method or a polysilicon fuse method.

Figure 13:
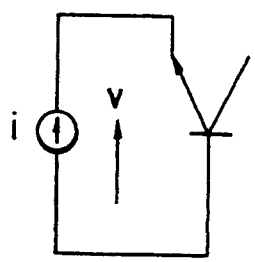
FIG. 13 is an explanation diagram when one switch is selected by a zener zapping method.
Figure 14:
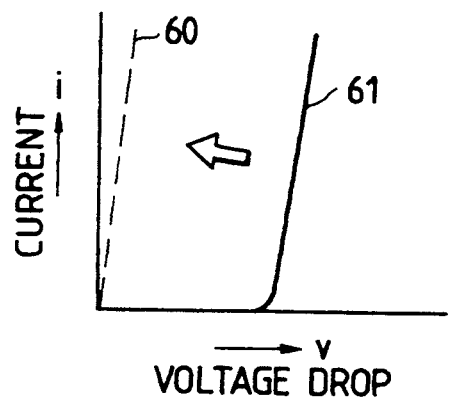
FIG. 14 depicts characteristic curves useful for explaining operation of the circuit shown in FIG. 13.

Hereunder, we will explain the zener zapping method in one transistor switch referring to FIGS. 13 and 14.

When current i flows between the emitter and the base of the transistor as shown in FIG. 13, the characteristic of the voltage drop v of the transistor becomes as shown in the solid line 61 of FIG. 14. When the p-n junction of the transistor is broken by applying high voltage and causing a large current to flow between the emitter and the base of the transistor, the v-i characteristic thereof is changed as shown in the dotted line 60 in FIG. 14. Accordingly, the transistor shows a comparatively large voltage drop v, when the p-n junction of the transistor is not broken by the current transmission between the emitter and the base of the transistor. On the other hand, the transistor shows the sufficient small voltage drop v, after the p-n junction is broken. When the breakage of the p-n junction of the transistor occurs, the p-n junction does not recover again. The switches 20 and 20A are formed by using the phenomenon mentioned above.

Figure 15:
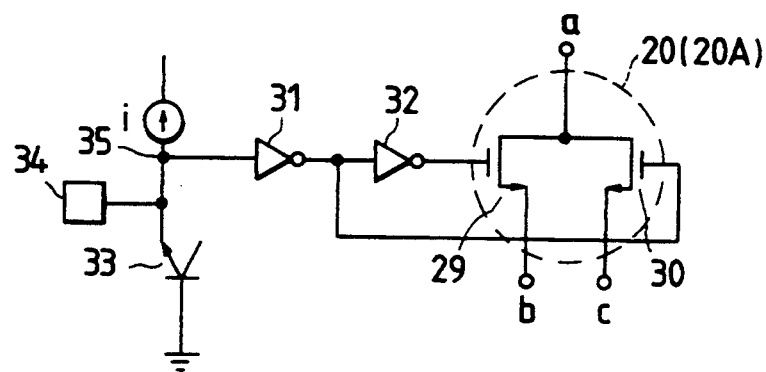
FIG. 15 is a circuit diagram showing one embodiment of each switch circuit shown in FIGS. 8–12 which is able to be utilized in a zener zapping method.

Referring to FIG. 15, each of 29 and 30 denotes a field effect transistor (FET). The switch 20 or 20A is formed by the two FETs 29 and 30. The terminals a, b and c in FIG. 15 correspond to these in FIGS. 8, 9 and 10. 31 and 32 are inverters. 33 denotes a transistor, 34 the pad, and 35 a node. As is apparent from FIG. 15, a predetermined small constant current i is always supplied between the emitter and the base of the transistor 33 from the power source of the IC 5. When the p-n junction of the transistor 33 is not broken yet, a comparatively large voltage drop v occurs in the p-n junction, as explained in FIG. 14. At this time, the node 35 is at a high level. Accordingly, the gate of the FET 29 is at a high level and the gate of the FET 30 is at a low level so that the FET 29 is turned ON and the FET 30 is turned OFF. As a result, the switch 20 is in the state in which the terminal a is connected to the terminal b. Next, suppose that the predetermined high voltage is applied to the pad 34, and a large current flows in the p-n junction between the emitter and the base of the transistor 33 so as to break the p-n junction. At this time, the potential of the node 35 is held at a low level so that the FET 29 is turned OFF and the FET 30 is turned ON, as apparent from FIG. 14. As a result, the switch 20 or 20A is placed in the state in which the terminal a is connected to the terminal c.

Accordingly, when the switch 20 or 20A shown in FIG. 15 is used as one of the memory 19 or 19A shown in FIGS. 8-10, the pad 34 can be used as one of the sensitivity adjustment pad 3 or the zero point adjustment pad 4. When the connecting state of the memory 19 or 19A is determined by selecting the state of each switch 20 or 20A in the manner mentioned above, the adjustment indexes a or B of the memory 19 or 19A are determined. As a result, the compensation of the detector 6 can be achieved digitally.

The selection and changeover of the switches 20 and 20A using a zener zapping method function as a kind of digital merit, and have high reliability. After the selection and changeover of the switches using this method is finished, the characteristic of the detector does not change with the passage of time.

Figure 16:
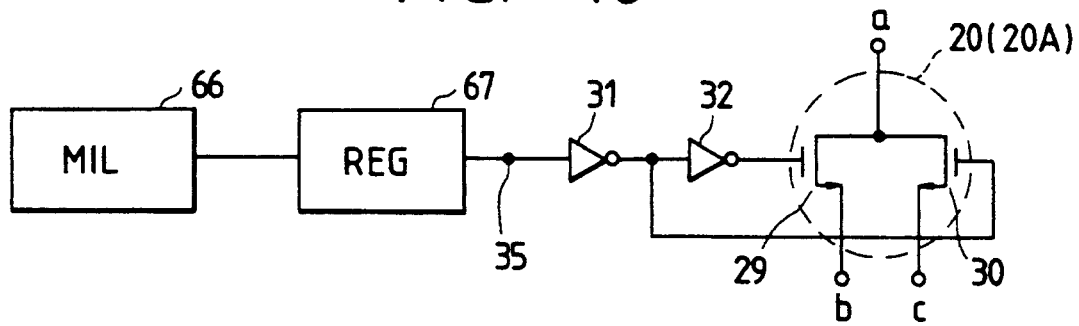
FIG. 16 is a circuit diagram showing another embodiment of each switch circuit shown in FIGS. 8–12 in which one switch is able to be selected by an output signal from a microcomputer mounted on the sensor using a zener zapping method.

Referring to FIG. 16, the changeover of the FETs 29 and 30 are controlled by the output signal from the microcomputer 66 through the register 67. The microcomputer 66 and the register 67 are mounted on the sensor.

Figure 17:
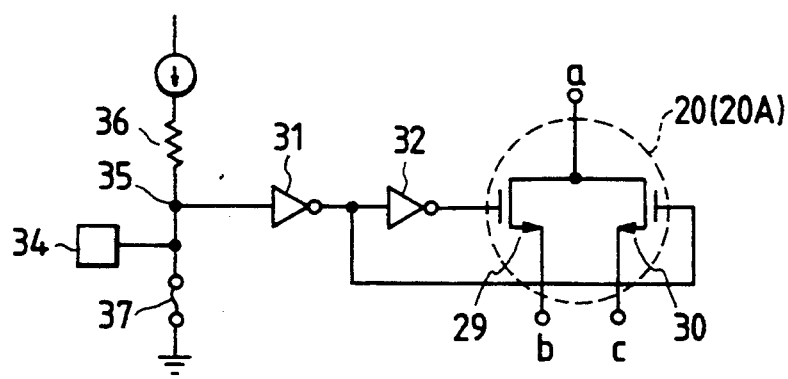
FIG. 17 is a circuit diagram showing one embodiment of each switch circuit shown in FIGS. 8–12 which is able to be applied silicon fuse method.

Next, we will explain the selection and the changeover of the switches 20 and 20A using polysilicon fuse method referring to FIG. 17.

In FIG. 17, 36 denotes a current limit resistance, and 37 the polysilicon fuse. The same parts as in FIG. 15 are indicated by the same reference symbol. The polysilicon fuse 37 and the resistance 36 are formed on the chip of the IC 5. The polysilicon fuse 37 is melted by causing current of more than a predetermined value to flow so that the fuse is burned out.

Figure 18A:
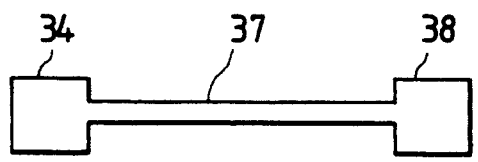
FIG. 18A and FIG. 18B are sketches for explaining the silicon fuse method.
Figure 18B:

FIG. 18A shows a current transmission state of the polysilicon fuse 37. FIG. 18B shows the burnout state by applying large current to the polysilicon fuse 37. 38 denotes a pad used for the ground.

The potential of the node 35 in FIG. 17 is held at a low level before the polysilicon fuse 37 is melted. After the polysilicon fuse 37 is melted by flow of a large current to the pad 34, the potential at the node 35 is at the high level. It is possible to select whether either the FET 29 or the FET 30 is turned ON or OFF. In this way, the switches 20 and 20A can be turned On or off.

The melting or nonmelting of the polysilicon fuse 37 can be used as a digital memory. Accordingly, the sensor using this method can provide high reliability.

Figure 11:
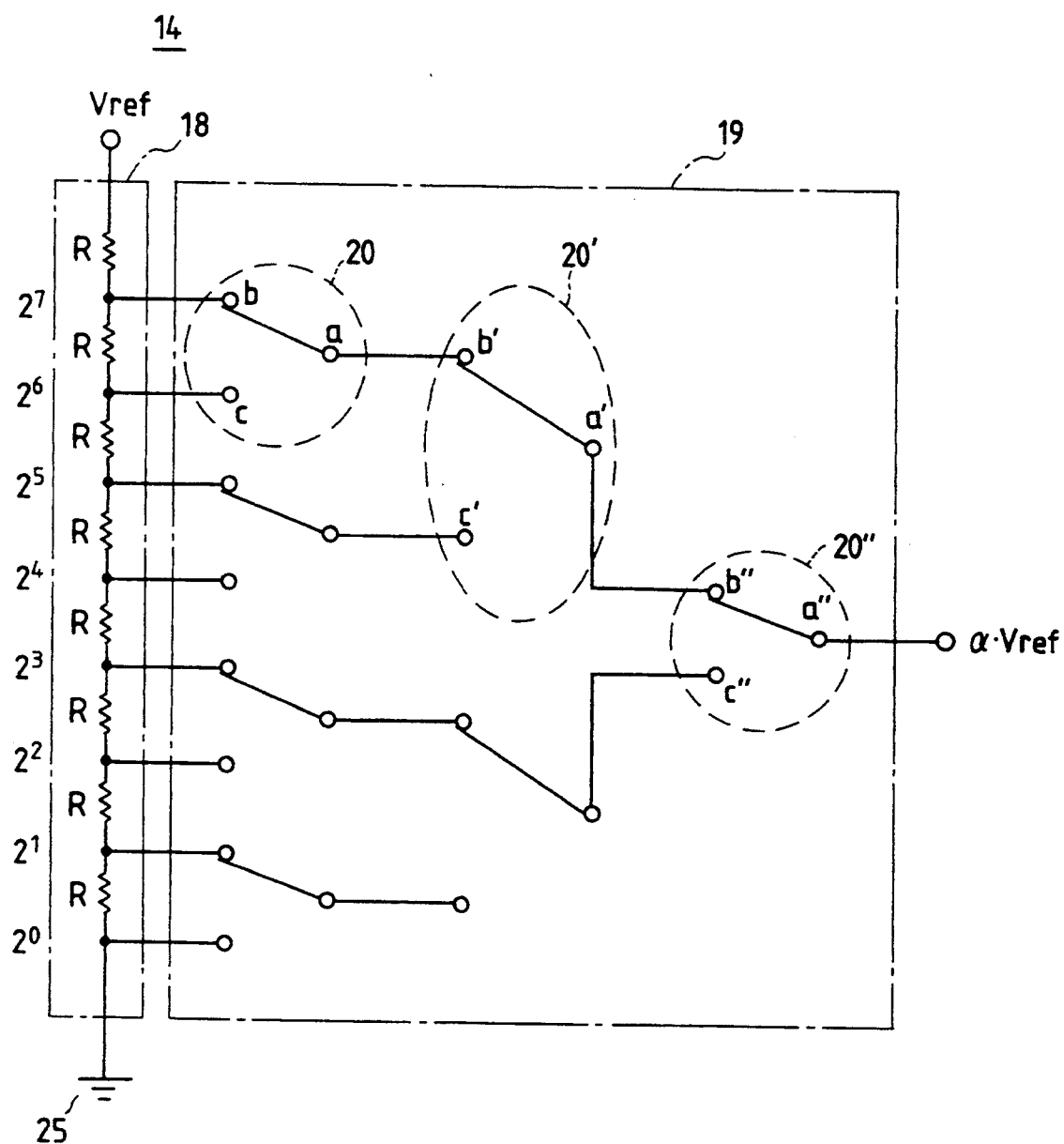
FIG. 11 shows another zero adjustment memory formed by series resistors in the signal processor of another embodiment of the present invention.
Figure 12:
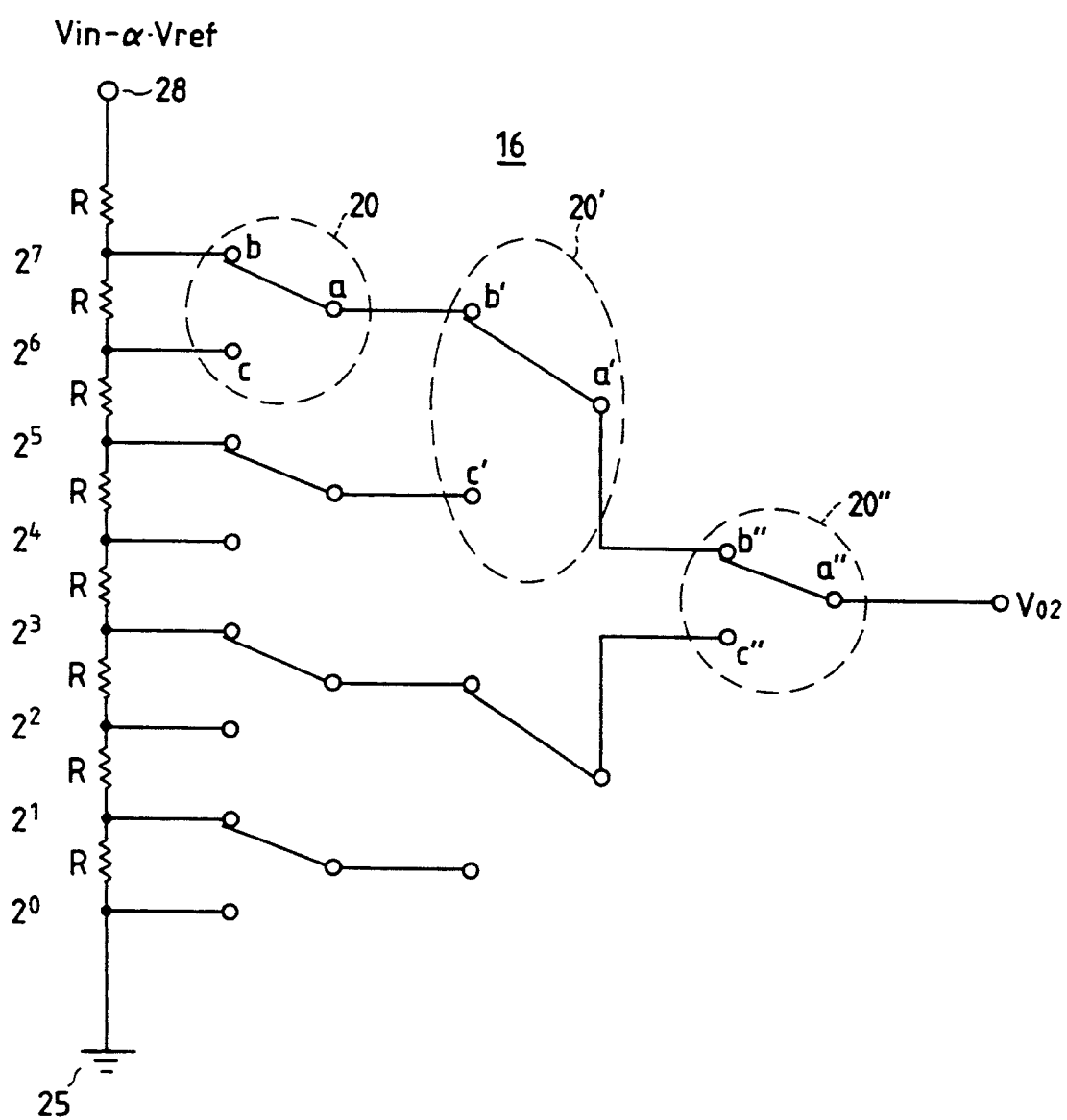
FIG. 12 shows another sensitivity adjustment memory formed by series of resistors in the signal processor of another embodiment of the present invention.

Referring to FIGS. 11 and 12, the switches 20, 20' and 20" can be selected using the zener zapping method or the polysilicon fuse method.

The resisters R and 2R shown in FIGS. 8, 9, 10 and 12 can be replaced by semiconductor elements or condensers.

Figure 19:
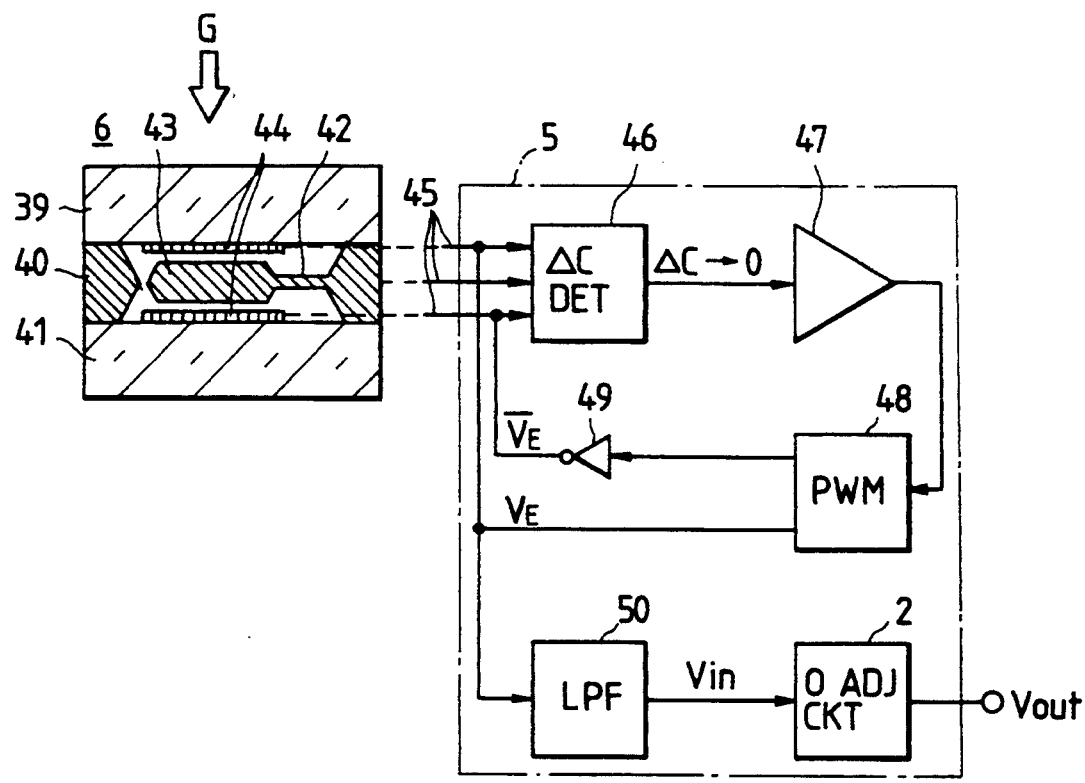
FIG. 19 illustrates the 5th embodiment of the present invention which is used as a semiconductor electrostatic capacitance type acceleration sensor.

Referring to FIG. 19, the detector 6 is formed as an acceleration sensor element. The acceleration sensor element is a type of semiconductor electrostatic capacitance. The sensor element is made of three layers in such a manner that a silicon plate 40 is placed between two sheets of glass substrate 39 and 41. The silicon plate 40 is formed by a cantilever 42 using etching and a movable electrode 43 which functions as an electrode and weight. Fixed electrodes 44 are provided on the inner surfaces of the glass substrates 39 and 41, facing the movable electrode 43. When an acceleration G is applied in the arrow direction shown in FIG. 19, the movable electrode 43 is displaced up and down, and the electrostatic capacitance which exists between the fixed electrodes 44 and the movable electrode 43 varies. The acceleration G is detected by the variation of the electrostatic capacitance. The detector 6 is connected to the IC 5 through the three lead wires 45. The IC 5 comprises a ΔC detector 46 for detecting the small variation quantity ΔC of the electrostatic capacitance, an amplifier 47, a pulse width modulator 48, an inverter 49, and a low pass filter 50. These circuits form the signal processing circuit 1 explained in FIG. 1. The detected signal Vin of the low pass filter is outputted to the output adjustment circuit 2.

Hereunder, we will explain the operation of the detector 6.

Figure 20:
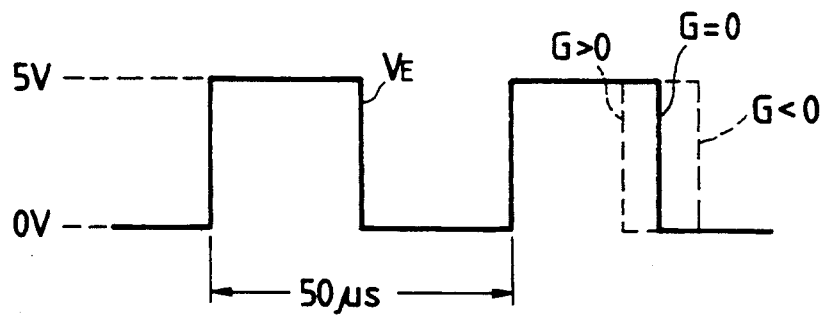
FIG. 20 shows a voltage waveform diagram for explaining operation of the sensor shown in FIG. 19.

The rectangular wave voltage $V_E$ shown in FIG. 20 is applied to the fixed electrodes 44 maintaining the potential of the silicon plate 40 at 5 volts. The output of the inverter 49 becomes a voltage whose phase is inverted from the rectangular wave voltage $V_E$. When the acceleration G is applied, the movable electrode is displaced, and the electrostatic capacitances $C_1$ and $C_2$ between the electrostatic electrode 43 and the fixed electrodes 44 vary. The difference ΔC between the electrostatic capacitances $C_1$ and $C_2$ is detected by a switched capacitor method. An electronic servo control by the electrostatic force is carried out in such a manner that the capacitance difference AC is converged to zero; namely, the movable electrode 43 holds a constant distance from the fixed electrodes 44. The electronic servo control takes place by inputting the output of the ΔC detector 46 from the amplifier 47 to the pulse width modulator 48, and controlling the pulse width of the rectangular wave voltage $V_E$ using the output signal of the pulse width modulator 48. As a result, the pulse width of the rectangular wave voltage $V_E$ varies depending on the magnitude of the acceleration G as shown in FIG. 20. The detected output signal Vin of DC voltage corresponding to the acceleration G can be obtained by passing the rectangular wave voltage $V_E$ through the low pass filter 50. The pulse width of the rectangular wave voltage $V_E$ changes in proportion to the acceleration G, when the cycle is 50 μsec, namely, the frequency is 20 KHz as shown in FIG. 20. The pulse width is decreased with positive acceleration G and increased with negative acceleration G. The output signal Vin is inputted to the output adjustment circuit 2 and the output signal Vout, which is the compensated signal of the sensitivity and the zero point, is obtained therefrom.

Figure 21:
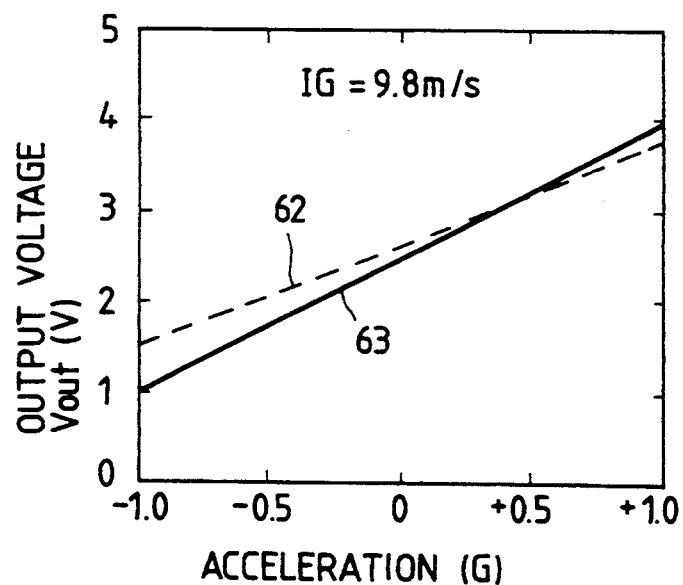
FIG. 21 shows characteristic curves of the output adjustment circuit shown in FIG. 19.

We will explain the compensation result of the sensor shown in FIG. 19 referring to FIG. 21. The dotted line 62 in FIG. 21 shows the characteristic of the sensor before the adjustment of the output adjustment circuit 2 takes place. The solid line 63 shows the desired characteristic thereof after the adjustment takes place. By adjusting the sensitivity and the zero point using the output adjustment circuit 2, outputs of 1.0 volt, 2.5 volts and 4.0 volts are obtained when the acceleration applied to the sensor is −1 G, 0 G and +1 G, respectively.

Figure 22:
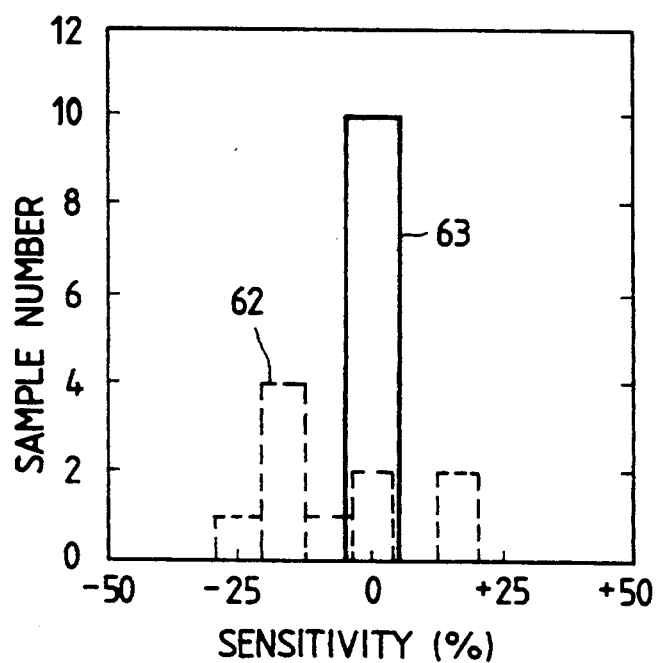
FIG. 22 shows a diagram for explaining the effect of the sensitivity adjustment of the present invention.

FIG. 22 shows the degree of fluctuation of 10 samples before and after the embodiments of the present invention are utilized for compensation of the sensitivity. The fluctuation of the sensitivity is ±25% before the adjustment takes place, as shown by the dotted characteristic 62. However, the fluctuation can be suppressed below ±1% after the adjustment takes place, as shown by the solid characteristic 63.

Figure 23:
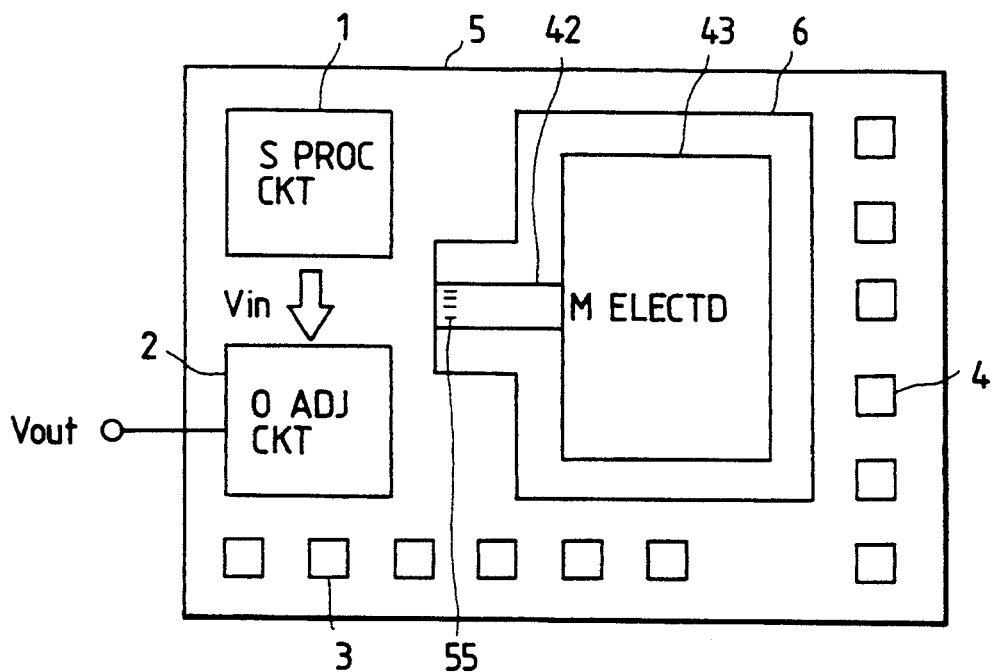
FIG. 23 illustrates the 6th embodiment of the present invention which is applied as a speed sensor.

Referring to FIG. 23, the cantilever 42 and the electrostatic capacitance type acceleration detector 6 are mounted on the IC 5 together with the signal processing circuit 1 and the output adjustment circuit 2. The embodiment shown in FIG. 23 has the effect that the size of the sensor can be made small so that the mounting of the sensor on a vehicle becomes easy compared with the embodiment shown in FIG. 1. The embodiment of FIG. 23 can be used as a semiconductor strain gage type acceleration sensor by forming the semiconductor strain gage 55 next to the fixed end of the cantilever 42.

Figure 24:
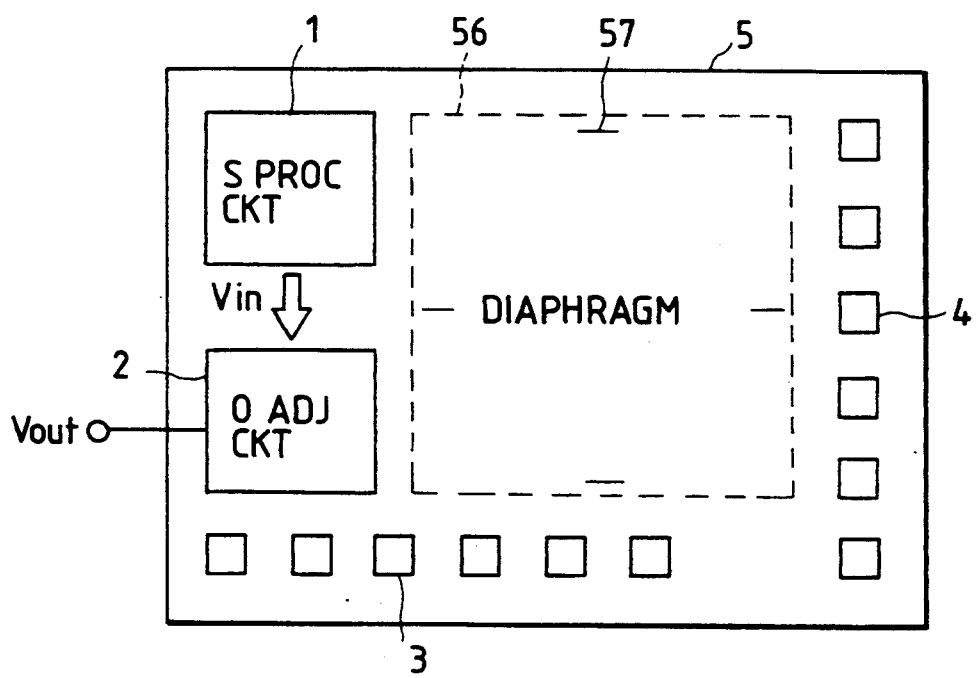
FIG. 24 illustrates the 7th embodiment of the present invention which is applied as a semiconductor pressure sensor.

Referring to FIG. 24, four semiconductor strain gages 57 are mounted at the periphery of a diaphragm 56 which is utilized for detecting pressure and is formed in an approximate square using a thin film.

The embodiments of the present invention have high reliability by digital adjustments in the sensitivity and the zero point adjustment.

According to the present invention, fluctuation relating to the sensitivity and to the zero point can be adjusted digitally so that the sensor of the present invention can maintain high reliability easily. Moreover, the present invention can provide all sorts of sensors which are small in size, easy to mount on a vehicle and low cost.

What we claim is:

1. A sensor for use in a vehicle, said sensor comprising:
   (a) a detector for detecting a physical quantity, the physical quantity being at least one of pressure, acceleration, and flow rate,
   (b) a signal control circuit coupled to said detector, and
   (c) adjusting means coupled to said signal control circuit for adjusting a characteristic of said detector, said signal control circuit and said adjusting means being formed as an integrated circuit on a single semiconductor chip, said adjusting means comprising a plurality of input pads for receiving digital control signals, a resistor network, a plurality of switches connected to select the resistance of said resistor network, a plurality of current-responsive elements connected to said plurality of switches and responsive to digital control signals applied to said input pads for assuming a conductive state to control said plurality of switches, and voltage control means responsive to the conductive state of said switches for adjusting the characteristics of said detector in accordance with the digital control signals received by said input pads.

2. A sensor according to claim 1, wherein said resistor network comprises a ladder type resistor network.

3. A sensor according to claim 1, wherein said resistor network comprises a plurality of series resistors.

4. A sensor according to claim 1, wherein said adjusting means comprises at least one of a zero adjustment memory and a sensitivity adjustment memory.

5. A sensor according to claim 4, wherein said adjusting means further comprises temperature characteristic adjusting means.

6. A sensor as claimed in claim 1, wherein each of said current-responsive elements comprises a transistor.

7. A sensor as claimed in claim 1, wherein each of said current-responsive elements comprises a fuse.

8. A sensor for use in a vehicle, said sensor comprising:
   (a) a detector for detecting a physical quantity, the physical quantity being at least one of pressure, acceleration and flow rate and corresponding to a parameter of operation of the vehicle or an engine of the vehicle,
   (b) a signal control circuit coupled to said detector, and
   (c) adjusting means coupled to said signal control circuit for adjusting a characteristic of said detector, said signal control circuit and said adjusting means being formed as an integrated circuit on a single semiconductor chip, said adjusting means comprising a plurality of input pads for receiving digital control signals, a resistor network, a plurality of switches connected to said resistor network, a plurality of current-responsive elements connected to said plurality of switches and responsive to digital control signals applied to said input pads for assuming a conductive state to control said plurality of switches, and voltage control means responsive to the conductive state of said switches for adjusting the characteristics of said detector in accordance with the digital control signals received by said input pads.

9. A sensor according to claim 8, wherein said adjusting means comprises means for adjusting a zero point and a sensitivity level of said detector.

10. A sensor according to claim 9, wherein each of said current-responsive elements comprises a current-responsive zener device.

11. A sensor according to claim 9, wherein each of said current-responsive element comprises a fuse.

12. A sensor according to claim 8, wherein said detector includes means for detecting air intake pressure.

13. A sensor according to claim 8, wherein said adjusting means comprises at least one of a zero adjustment memory and a sensitivity adjustment memory.

14. A sensor used for a vehicle according to claim 13, wherein said adjusting means further comprises temperature characteristic adjusting means.

15. An acceleration detection sensor for use in a vehicle, said acceleration detection sensor comprising:
   (a) an acceleration detector, for detecting acceleration of the vehicle,
   (b) a signal control circuit coupled to said acceleration detector, and
   (c) adjusting means coupled to said signal control circuit for adjusting a characteristic of said acceleration detector, said signal control circuit and said adjusting means being formed as an integrated circuit on a single semiconductor chip, said adjusting means comprising a plurality of input pads for receiving digital control signals, a resistor network, a plurality of switches connected to said resistor network, a plurality of current-responsive elements connected to said plurality of switches and responsive to digital control signals applied to said input pads for assuming a conductive state to control said plurality of switches, and voltage control means responsive to the conductive state of said switches for adjusting the characteristics of said detector in accordance with the digital control signals received by said input pads.

16. An acceleration detection sensor according to claim 15, wherein each of said current-responsive element comprises a current-responsive zener device.

17. An acceleration detection sensor according to claim 15, wherein each of said current-responsive elements comprises a fuse.

18. An acceleration detection sensor according to claim 15, wherein said adjusting means comprises at least one of a zero adjustment memory and a sensitivity adjustment memory.

19. An acceleration detection sensor according to claim 18, wherein said adjusting means further comprises temperature characteristic adjusting means.

20. An acceleration detection sensor as claimed in claim 15, wherein said acceleration detector comprises a pair of fixed electrodes, and a movable electrode between said fixed electrodes and responsive to acceleration of the vehicle for moving relative to said fixed electrodes.

21. A sensor for use in a vehicle, said sensor comprising:
   (a) a semiconductor substrate and a detector mounted on said semiconductor substrate, for detecting a physical quantity, the physical quantity being at least one of pressure, acceleration and flow rate,
   (b) a signal control circuit mounted on said semiconductor substrate and coupled to said detector, and
   (c) an output adjustment circuit mounted on said semiconductor substrate, formed separately from said signal control circuit, and coupled to said signal control circuit, for adjusting a characteristic of said detector, said output adjustment circuit comprising a plurality of input pads for receiving digital control signals, a resistor network, a plurality of switches connected to said resistor network, a plurality of current-responsive elements connected to said plurality of switches and input pads responsive to digital control signals applied to said for assuming a conductive state to control said plurality of switches, and voltage control means responsive to the conductive state of said switches for adjusting the characteristics of said detector in accordance with the digital control signals received by said input pads.

22. A sensor for use in a vehicle, said sensor comprising:
   (a) a first semiconductor substrate and a detector mounted on said first semiconductor substrate, for detecting a physical quantity, the physical quantity being at least one of pressure, acceleration, and flow rate,
   (b) a second semiconductor substrate and a signal control circuit mounted on said second semiconductor substrate and coupled to said detector, and
   (c) an output adjustment circuit mounted on said second semiconductor substrate, formed separately from said signal control circuit, and coupled to said signal control circuit, for adjusting a characteristic of said detector, said output adjustment circuit comprising a plurality of input pads for receiving digital control signals, a resistor network, a plurality of switches connected to said resistor network, a plurality of current-responsive elements connected to said plurality of switches and responsive to digital control signals applied to said input pads for assuming a conductive state to control said plurality of switches, and voltage control means responsive to the conductive state of said switches for adjusting the characteristics of said detector in accordance with the digital control signals received by said input pads.

* * * * *